United States Patent [19]

Williford, Jr.

[11] Patent Number: 5,558,110

[45] Date of Patent: Sep. 24, 1996

[54] APPARATUS FOR REMOVING PARTICULATE MATTER

[76] Inventor: John F. Williford, Jr., 7155 N.E. 126th St., Kirkland, Wash. 98034

[21] Appl. No.: 300,415

[22] Filed: Sep. 2, 1994

Related U.S. Application Data

[62] Division of Ser. No. 97,172, Jul. 23, 1993, Pat. No. 5,364,474.

[51] Int. Cl.$^6$ ............................................. B08B 3/02
[52] U.S. Cl. ........................ 134/56 R; 134/153; 134/148; 134/902
[58] Field of Search .................................. 134/153, 147, 134/148, 902, 172, 198, 56 R, 58 R

[56] References Cited

U.S. PATENT DOCUMENTS

| | | | |
|---|---|---|---|
| 2,699,403 | 1/1955 | Courts | 117/47 |
| 3,676,963 | 7/1972 | Rice et al. | 51/320 |
| 3,702,519 | 11/1972 | Rice et al. | 51/310 |
| 3,765,051 | 10/1973 | Wanat | 134/153 X |
| 4,027,686 | 6/1977 | Shortes et al. | 134/33 |
| 4,038,786 | 8/1977 | Fong | 51/310 |
| 4,389,820 | 6/1983 | Fong et al. | 51/410 |
| 4,489,740 | 12/1984 | Rattan et al. | 134/140 |
| 4,544,446 | 10/1985 | Cady | 134/902 X |
| 4,631,250 | 12/1986 | Hayashi | 430/329 |
| 4,655,847 | 4/1987 | Ichinoseki et al. | 134/7 |
| 4,744,181 | 5/1988 | Moore et al. | 51/436 |
| 4,747,421 | 5/1988 | Hayashi | 134/201 |
| 4,806,171 | 2/1989 | Whitlock et al. | 134/7 |
| 4,857,113 | 8/1989 | Hodge | 134/32 |
| 4,930,531 | 6/1990 | Bullu | 134/167 |
| 4,932,168 | 6/1990 | Tada et al. | 51/436 |
| 4,936,922 | 6/1990 | Cherry | 134/22.18 |
| 5,001,084 | 3/1991 | Kawai et al. | 437/231 |
| 5,025,597 | 6/1991 | Tada et al. | 51/7 |
| 5,035,750 | 7/1991 | Tada et al. | 51/410 |
| 5,062,898 | 11/1991 | McDermott et al. | 134/7 |
| 5,125,979 | 6/1992 | Swain et al. | 134/7 |
| 5,129,956 | 7/1992 | Pickering et al. | 134/15 |
| 5,147,466 | 9/1992 | Ohmori et al. | 134/7 |
| 5,259,890 | 11/1993 | Goff | 134/32 |
| 5,349,978 | 9/1994 | Sago et al. | 134/902 |
| 5,372,652 | 12/1994 | Srikrishnan et al. | |
| 5,419,733 | 5/1995 | Johnson et al. | |

FOREIGN PATENT DOCUMENTS

| | | | |
|---|---|---|---|
| 62-188823 | 8/1987 | Japan | 134/902 |
| 2-253620 | 10/1990 | Japan | 134/902 |
| 4-44227 | 2/1992 | Japan | 134/902 |
| 4-213827 | 8/1992 | Japan | 134/902 |
| 354334 | 12/1992 | Japan | 134/902 |
| 5-90237 | 4/1993 | Japan | 134/902 |
| 5-152269 | 6/1993 | Japan | 134/902 |
| 5-144793 | 6/1993 | Japan | 134/902 |

*Primary Examiner*—Frankie L. Stinson
*Attorney, Agent, or Firm*—Christensen, O'Connor, Johnson & Kindness PLLC

[57] ABSTRACT

A method for controlling the effective velocity of a spray of cleaning material in order to remove particulate matter and other contamination from a surface of a workpiece. The surface under treatment is moved relative to the position of a sprayhead in order to increase or reduce the velocity at which the spray impacts the surface. In one embodiment, the workpiece is mounted on a disk-shaped support plate. The sprayhead tracks across the support plate to direct the spray over the entire workpiece. The support plate is rotated towards the sprayhead to increase the effective spray velocity, and away from the sprayhead to decrease the effective spray velocity. Another embodiment of the invention adjusts the speed of rotation of the support plate in such a manner that the spray maintains a constant effective velocity as the sprayhead is moved radially across the support plate.

16 Claims, 5 Drawing Sheets

APPARATUS FOR REMOVING PARTICULATE MATTER

This is a divisional of the prior application Ser. No. 08/097,172, filed on Jul. 23, 1993, of John F. Williford for METHOD AND APPARATUS FOR REMOVING PARTICULATE MATTER, the benefits of the filing date, of which are hereby claimed under 35 U.S.C. §120 now U.S. Pat. No. 5,364,474.

FIELD OF THE INVENTION

The present invention relates to ultra cleaning methods in general and, in particular, to methods of removing microscopic particles with accelerated sprays.

BACKGROUND OF THE INVENTION

In recent years, a great deal of attention has been given to improving techniques for cleaning surfaces. Surfaces are often cleaned to remove contamination in the form of film-like processing residues (cutting or lubricating oils, mold release materials, salts and oils from finger prints received in handling, etc.). Film-type residues are typically removed by solvent processes, using fluid baths, sprays, vapor cleaners or other methods and apparatus well known and used commercially. Such solvent processes also remove other types of contamination in the form of particulate materials that may include metal, ceramic or polymeric fragments created during a manufacturing process, or deposited by environmental (e.g., airborne) contamination.

In certain applications, the need for improved levels of cleanliness have become more stringent, and traditional methods of cleaning, such as the use of solvent baths, have proven unable to provide satisfactory results. This fact is particularly true in the electronics industry where effective removal of submicron particulate contamination greatly affects the yield of high resolution electronic devices such as integrated circuits as well as a number of other products of commercial importance.

As the size of a particle to be removed from a surface decreases, the removal of such particles becomes increasingly difficult. For this reason, conventional approaches that make use of solvent dips or washes, or fluid streams, lose effectiveness as particle size falls substantially below 1 micrometer (micron or μm). The relative force of adhesion of these particles rises exponentially as the particle size decreases. Table I, below, reports relative adhesion force as a function of particle size.

TABLE I

| Particle Adhesion of Glass Beads on a Glass Slide | |
|---|---|
| Particle Size (μm) | Relative Force to displace (gravitational units) |
| 100 | 510 |
| 50 | 2,159 |
| 10 | 57,716 |
| 1 | 674,600 |
| 0.1 | 749,552,300 |

Source: "Particulate Removal with Dense $CO_2$ Fluids," D. Zhang, D. B. Kittelson, B. Y. H. Liu, 1992, presented by McHardy at the Third International Workshop on Solvent Substitution, Phoenix, Ari., 1992.

As the force necessary to break the combined adhesion and binding charges of a particle rises, the amount of force that can be transferred to the particle by a fluid stream remains constant due to the fixed cross-sectional area of the particle. Additionally, boundary layer effects near the surface, taking the form of laminar flows of the cleaning gases or fluids over the particles, further isolate microscopic particles from removal. Thus, as the particle size decreases, the ability to displace such particles with fluid streams falls off to the point that it becomes nearly impossible to remove microscopic particulates by spraying the particles with streams of solvent.

In recognition of the ineffective physics of high pressure gas or solvent streams for particulate removal, other investigators have used the kinetic energy of droplet sprays or finely divided solids to remove particulates by means of momentum transfer. Such droplets typically comprise water or $CO_2$ snow sprays that are directed with a specialized nozzle onto the workpiece being cleaned. Often high pressure driving gases are used to accelerate the snow spray to a sufficient velocity to clean the workpiece.

These cleaning methods are similar to methods wherein naturally occurring sand or manufactured abrasive grit is used as a blasting agent for descaling and cleaning purposes. The principles involved in heavy cleaning or stripping applications consist of supplying sufficient kinetic energy of impact to the blasting agent in order to exceed the adhesive or cohesive strength of the material being removed or abraded and are well known to those skilled in the art. The use of sublimable or phase-changing materials (e.g., water or dry ice) instead of sand or grit allow for easier cleanup and eliminate residues of hard particles, which could damage products in later use.

These aggressive blasting applications, which can produce heavy material abrasion or wear, lie at one end of a continuum of related cleaning processes. At the other end of the continuum are fine sprays of liquid and/or finely divided solid matter, which carry modest levels of kinetic energy. Fine sprays of comparatively low energy, particularly with liquids or low hardness materials such as ice or $CO_2$ snow, cause little or no damage to surfaces, and are known to be effective for gentle cleaning.

However, as shown earlier in Table I, the binding forces for very finely divided matter disposed on a surface increase exponentially as the size of the particles decreases. With some materials, the binding energies of fine matter on surfaces begin to approach the cohesive strength of the underlying matter under treatment. As impinging sprays are made more aggressive by enlargement of the droplet mass or velocity (or both) in attempts to improve submicron particulate removal efficiency, the threshold level for damage to the underlying material is approached.

One difficulty of cleaning methods that do not control blast particle size closely (e.g., single-stage phase transformation at an orifice) is that a range of droplet sizes and mixed phases are present. A substantial amount of the sprayed material is too fine and fugitive to have any effect, yielding low efficiency, and calling for higher and higher pressures for accelerating gases. At the same time, the presence of solid or liquid phase material in larger masses may produce damage to the surfaces being cleaned with high driving pressures.

The use of high driving gas pressures also accelerates the sublimation of solid phase $CO_2$, providing low efficiency in the use of the material as a cleaning agent. In addition, the use of a driving gas such as high pressure air or nitrogen adds complexity, and creates additional opportunities for the introduction of impurities.

To summarize the existing art, the velocity of spray or blasting particles has been varied using the following known methods:

1. Use of air or another driving gas to accelerate pellets or sprayed matter, in a manner analogous to sand blasting.

2. Use of the dynamics of liquid spray from siphon-type bottles, wherein the driving force may be the vapor pressure of the liquefied or pressurized gas in the storage cylinder. Siphon pressure may be augmented by an additional head pressure (e.g., as in supercritical fluid extraction grade $CO_2$, which is supplied with a 2,000 psi head of helium).

3. Airless sprayers to deliver high speed droplets.

4. Centrifugal force to accelerate pellets of $CO_2$ ice so that pellets can be ejected from a centfifuge at high velocity.

All of these methods suffer from one of two problems. Either the particles sprayed on the workpiece are so hard that the workpiece may be damaged or, if the sprays are softer, the equipment required to accelerate the spray are dangerous and a possible source of contamination. Thus, there is a need for a new method of controlling the kinetic energy of cleaning sprays impinging on surfaces that alleviates some of the shortcomings in the art, as now known and practiced.

SUMMARY OF THE INVENTION

The present invention is a method and apparatus for increasing the effective velocity of a cleaning material directed at an object to be cleaned. The method comprises the steps of directing an amount of cleaning material at the object and moving the object relative to the cleaning material to change the velocity at which the cleaning material impacts the surface of the object.

In one embodiment of the invention, the objects to be cleaned are mounted on a support disk. A sprayhead produces a spray of cleaning material that is directed onto the support plate. The sprayhead moves along the radius of the support plate to direct the spray onto the entire surface of the object to be cleaned. The support plate is rotated counter to the direction of the spray to increase the effective velocity of the spray as it impacts the objects mounted on the support plate. In a second embodiment of the present invention, one or more position sensors detect the position of the sprayhead. A microcontroller circuit varies the speed at which the support plate rotates as a function of the position of the sprayhead. The speed of rotation can be adjusted so that the effective velocity of the spray remains constant as the sprayhead moves radially across the support plate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
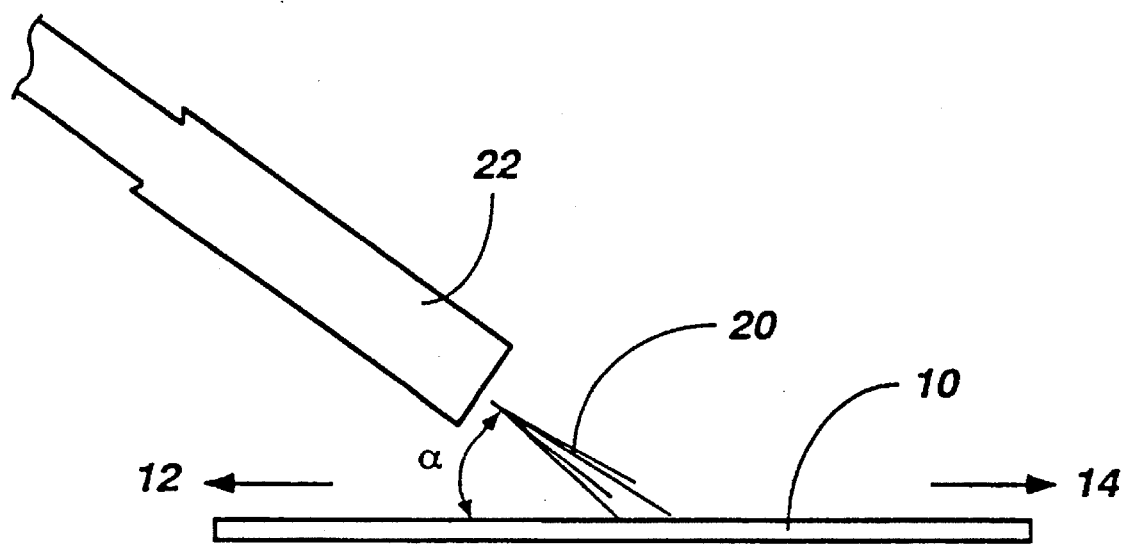
FIG. 1 is a simplified schematic drawing illustrating a method of cleaning according to the present invention.

FIG. 1 illustrates, in a simplified fashion, the cleaning method according to the present invention. A workpiece 10 to be cleaned is impinged by a spray of cleaning material 20 delivered from a sprayhead 22. The amount of kinetic energy contained in the spray droplets is a function of the mass of the spray droplets and their velocity. As indicated above, the problem with prior art spray cleaning systems is that it is difficult to impart enough kinetic energy to the spray to dislodge microscopic contaminants from the workpiece. Because the size of the droplets tend to remain fairly uniform, the only way to increase the kinetic energy of the spray is to increase the spray velocity. However, even with high pressure gas accelerators, the maximum spray velocity obtainable in a typical prior art spray cleaning system is on the order of 145 feet per second. The present invention increases the effective kinetic energy of the spray by moving the workpiece in relation to the spray.

In the present invention, the relative velocity of the spray is controlled by moving the workpiece under treatment in a direction 12 that is counter to the direction of the spray, or in a direction 14 that is the same as the direction of the spray. If the workpiece is moved in a direction 12 toward the spray, the effective velocity of the spray is increased. On the other hand, if the workpiece is moved in a direction 14 away from the spray, the effective velocity of the spray is decreased. The sprayhead 22 is maintained at an angle α to the surface of the workpiece 10. If the spray has a velocity V1, and the workpiece is moving toward the spray at a velocity V2, then the effective velocity of the spray, in a direction horizontal to the surface of the workpiece, is given by:

$$V1 Cos(\alpha) + V2 \tag{1}$$

As can be seen from this equation, a greater effective velocity is obtained when the angle α is small.

Figure 2:
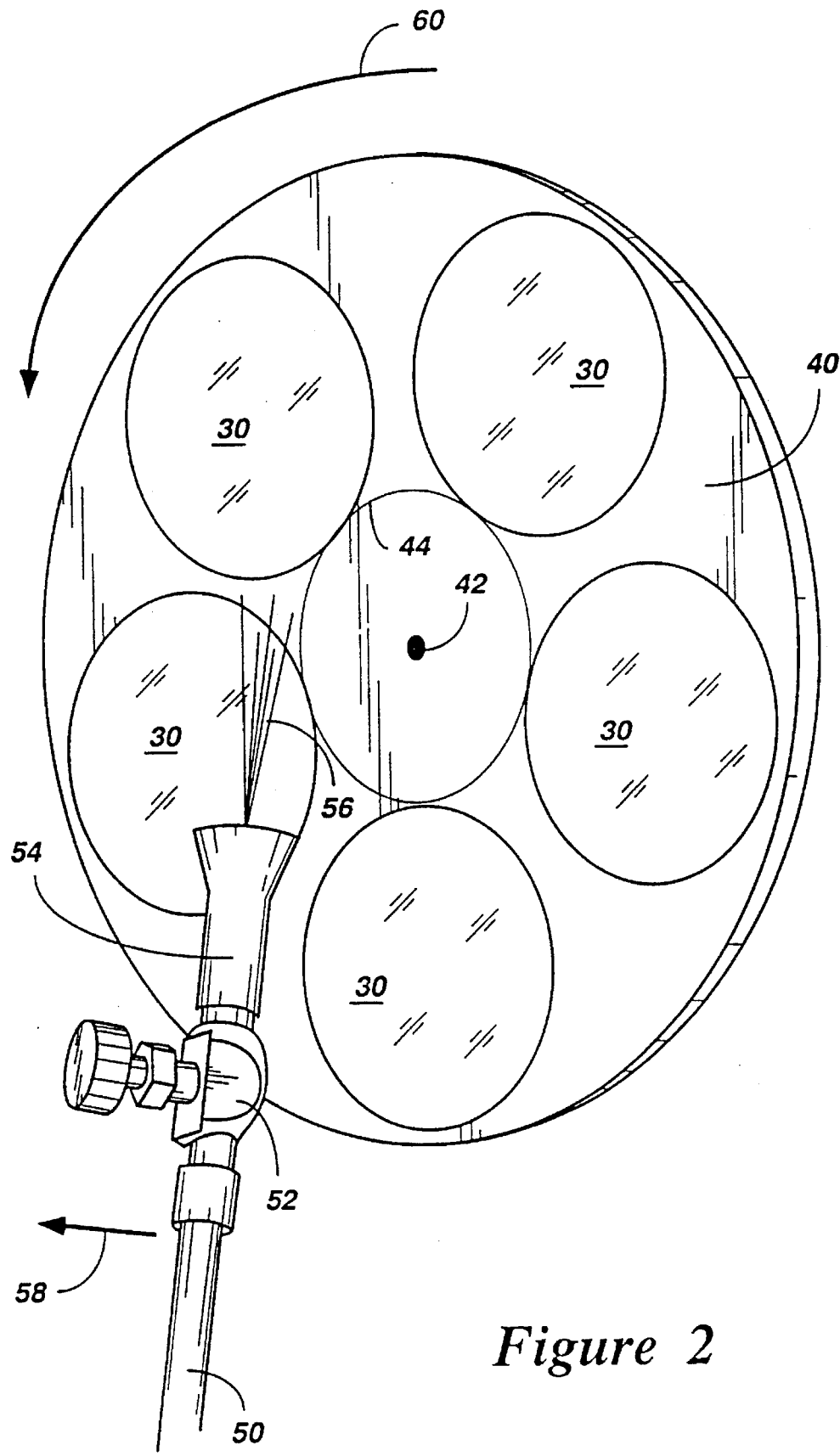
FIG. 2 is a perspective drawing of a first embodiment of the present invention used to clean a plurality of flat disks, such as silicon wafers.

FIG. 2 shows a first embodiment of the present invention used to clean a plurality of silicon wafers 30. The silicon wafers 30 are removably affixed around an outer perimeter of a support plate 40 by any of a number of suitable mechanisms such as a vacuum chuck (not shown). The support plate 40 is rotated about a center point 42 by a motor (also not shown). A solvent or spray material, preferably comprising liquid $CO_2$, is supplied through a hollow tube 50 to a metering valve 52, where the solvent material is conditioned by a sprayhead 54 and ejected as a spray 56. The spray 56 is directed onto the spinning wafers 30 at an angle less than 90° to the surface of the wafers. The sprayhead is movable in a direction 58 from an inner diameter 44 to an outer diameter that is established by the perimeter of the support plate 40.

The support plate 40 is rotated by the motor in a direction 60 counter to the direction of the spray 56. The rotation of the support plate in the direction 60 provides an enhancement of the relative velocity of the spray droplets or elements and the surface of the wafers 30 under treatment. If the direction of support plate rotation were reversed such that the support plate is rotated in the same direction as the spray, the relative velocity of the droplets or spray elements and the surface of the wafers under treatment would be reduced.

By way of illustration, assume the support plate 40 shown in FIG. 2 has a diameter of 24 inches and the silicon wafers 30 each have an 8-inch diameter. If the support plate 40 is rotated at 3,600 rpm the linear velocity of the support plate at a position four inches from the center point 42 of the support plate would be about 126 fps (3.84 m/sec). At a fixed rate of rotation, the linear velocity increases radially outward, reaching a maximum linear velocity of about 377 fps (11.49 m/sec) at the perimeter of the support plate 40.

In Table 2, below, the effect of rotating the support plate 40 counter to the direction of the spray 56 is illustrated, based on a rotational speed of 3,600 rpm and a spray velocity of 146 fps (4.45 m/sec).

TABLE 2

Spray or Blast Particle Velocity Enhancement

| Radial Location (inches) | Spray Velocity (fps) | Surface Velocity (fps) | Relative Velocity of Spray and Surface (fps) |
|---|---|---|---|
| 4 | 146 | 126 | 272 |
| 5 | 146 | 157 | 303 |
| 6 | 146 | 188 | 334 |
| 7 | 146 | 220 | 366 |
| 8 | 146 | 251 | 397 |
| 9 | 146 | 283 | 429 |
| 10 | 146 | 314 | 460 |
| 11 | 146 | 346 | 492 |
| 12 | 146 | 377 | 523 |

Referring to Table 2, the spray velocity of 146 fps is enhanced by adding the opposing velocity of the rotating work (assuming a low angle of the spray with respect to the surface of the wafers) at various positions radially outward from the center point 42. Given the fixed rotational rate of 3,600 rpm, the relative velocity at spray/surface impact ranges from 272 fps at a position 4 inches from the center of the support plate to 523 fps at the perimeter of the support plate. This provides a percent increase of 92% at the 4-inch radial range, and a maximum increase of 258% at the 12-inch radial location, in relative velocity of spray/surface impact, as compared with the static spray of 146 fps.

By reversing the direction of rotation or relocating the sprayhead and its direction of traverse, the silicon wafers 30 disposed on the support plate may be moved away from the sprayhead, traveling in substantially the same direction as the spray. In this situation, the linear velocity of the support plate is subtracted from the velocity of the spray to reduce the velocity of the spray relative to the surface of the silicon wafers 30 under treatment.

The present invention allows the kinetic energy of a cleaning spray to be increased without the need for expensive and potentially dangerous high pressure accelerators. This increased kinetic energy can dislodge much smaller particles on the workpieces to be cleaned than were able to be removed using prior art blast or snow cleaning systems.

Optimum velocity relationships with some products under treatment may be obtained by locating the workpieces within an annulus rotated at a constant speed. So long as the rotational speed and positioning of the work and sprayhead lie within an acceptable range and produce an effective range of relative velocities, this simple approach will be acceptable.

In other applications, where the difference between impact kinetics for desired cleaning and the damage threshold for the material being cleaned is small, it may be necessary to more closely control the relative velocity of the spray and surface under treatment. This problem can be addressed by providing a constant linear velocity of the surface under the sprayhead, regardless of the radial location of the sprayhead. This outcome is readily achieved by varying the rotational speed of the support plate as a function of the radial location of the sprayhead.

Figure 3:
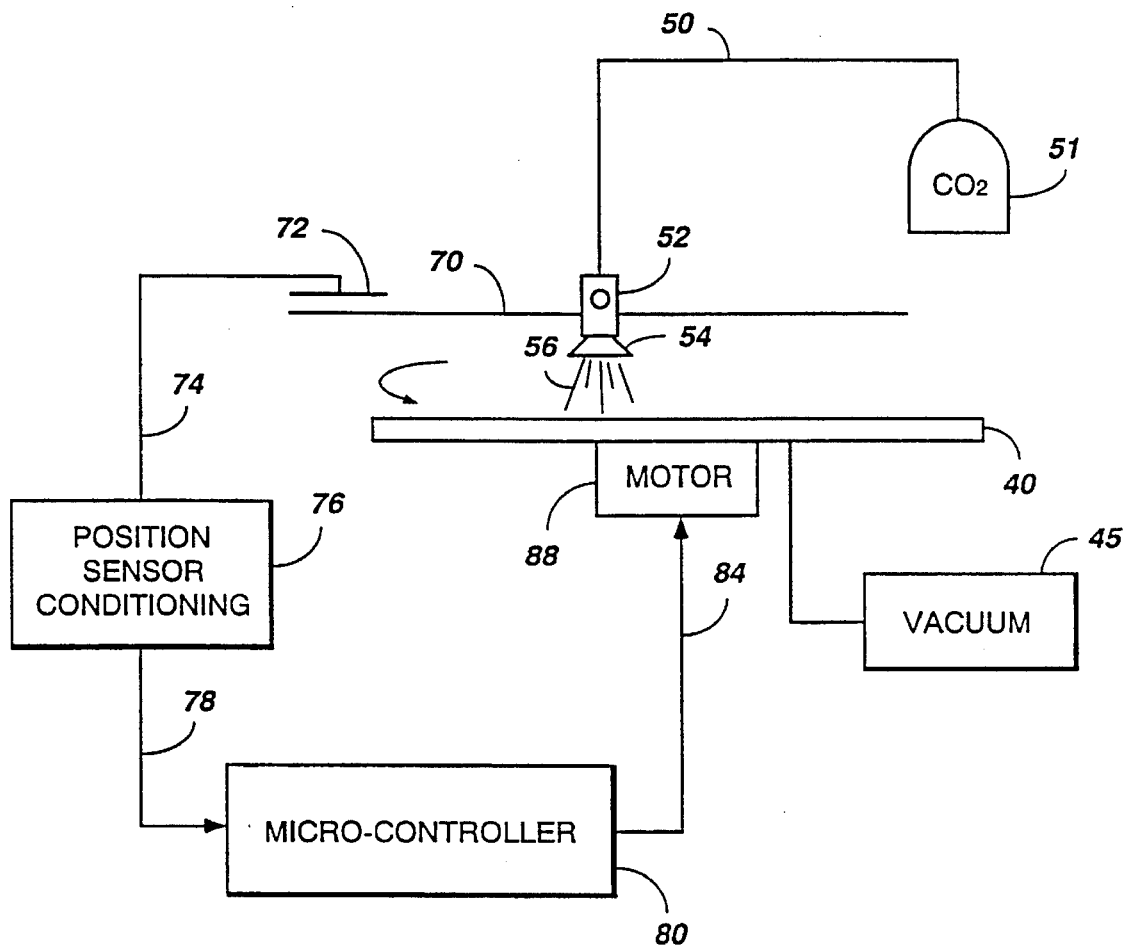
FIG. 3 is a block diagram of a cleaning apparatus according to a second embodiment of the present invention.

FIG. 3 is a block diagram of a variable velocity cleaning system according to a second embodiment of the present invention. As with the cleaning system described above, a cleaning solution such as liquid $CO_2$ is stored in reservoir 51 and delivered under pressure through a tube 50 to a metering valve 52. The cleaning solution is discharged from the sprayhead 54 in the form of either a spray or a snow onto the surface of the support plate 40. Objects to be cleaned may be secured onto the support plate 40 by a plurality of conventional vacuum chucks that are driven by a vacuum unit 45. The sprayhead 54 moves radially across the face of the support plate 40 on a track 70. The track 70 is a motor driven, threaded rod or other type of linkage mechanism that allows for the precise positioning of the sprayhead. The details of the track 70 are well known to those of ordinary skill in the art and therefore need not be discussed further.

One or more position sensors 72 sense the position of the sprayhead. Suitable position sensors are optical, inductive, capacitive, resistive, and numerous other types well known in the art. The sensors produce an analog electrical signal that is proportional to the radial position of the sprayhead. This analog signal is transmitted over a lead 74 to a position sensor conditioning circuit. The conditioning circuit amplifies the signal produced by the sensors and converts the analog signal into a digital signal that can be interpreted by a computer.

The output of the position sensor conditioning circuit is transmitted over a lead 78 to a microcontroller circuit 80. The microcontroller circuit includes a microprocessor that is programmed to read the output signal of the position sensor conditioning circuit and to produce a motor drive signal on a lead 84 that changes the speed of a variable speed motor 88. The microcontroller circuit 80 changes the speed of the motor 88 so that the effective velocity of the spray remains constant at the point where the spray impacts the surface of the support plate 40 regardless of the radial position of the sprayhead 54.

In the example of the silicon wafer cleaning method above, we may select 3,600 rpm at the 4-inch inner radius as producing a hypothetically ideal linear velocity of 126 fps. If we wish to maintain this ideal constant linear velocity of the surface under treatment as the sprayhead traverses from the inner 4-inch radius to a maximum radius of 12 inches at the perimeter of the support plate, then the speed of rotation must be reduced incrementally from 3,600 rpm to 1,200 rpm.

For any increasingly large radial position, the requisite speed change is directly and inversely proportional to the radius, if the intent is to obtain a constant linear velocity. The ratio of fastest to slowest speed required to maintain the constant linear velocity is on the order of 3:1. In addition to the microcontroller 80 described above, variable transmissions, rheostatic motor controllers, and variable-speed air motors can be used to achieve the desired variation in rotational speed. Additionally, instead of using externally mounted position sensors, information regarding the required rotational speed as a function of the position of the sprayhead may be applied directly on the support plate in the form of a digital encoding, as is done with laser-read audio disks. The encoding could be read by an optical sensor disposed on the sprayhead and used to vary the speed of rotation accordingly. Alternatively, the position of the sprayhead may be mechanically read by a cam and cam follower arrangement, through an electrical analog device such as a potentiometer, or by numerous other means well known to those of ordinary skill in the art.

As will be apparent to those skilled in the art, the microcontroller 80 could be programmed to vary the effective velocity of the spray in relation to the position of the sprayhead in other ways besides providing a constant spray velocity. For example, the spray could be made to have a greater effective velocity towards the center of the support plate 40 and a slower speed towards the perimeter, etc. The particular effective spray velocity desired will often depend on the material to be cleaned.

Figure 4:
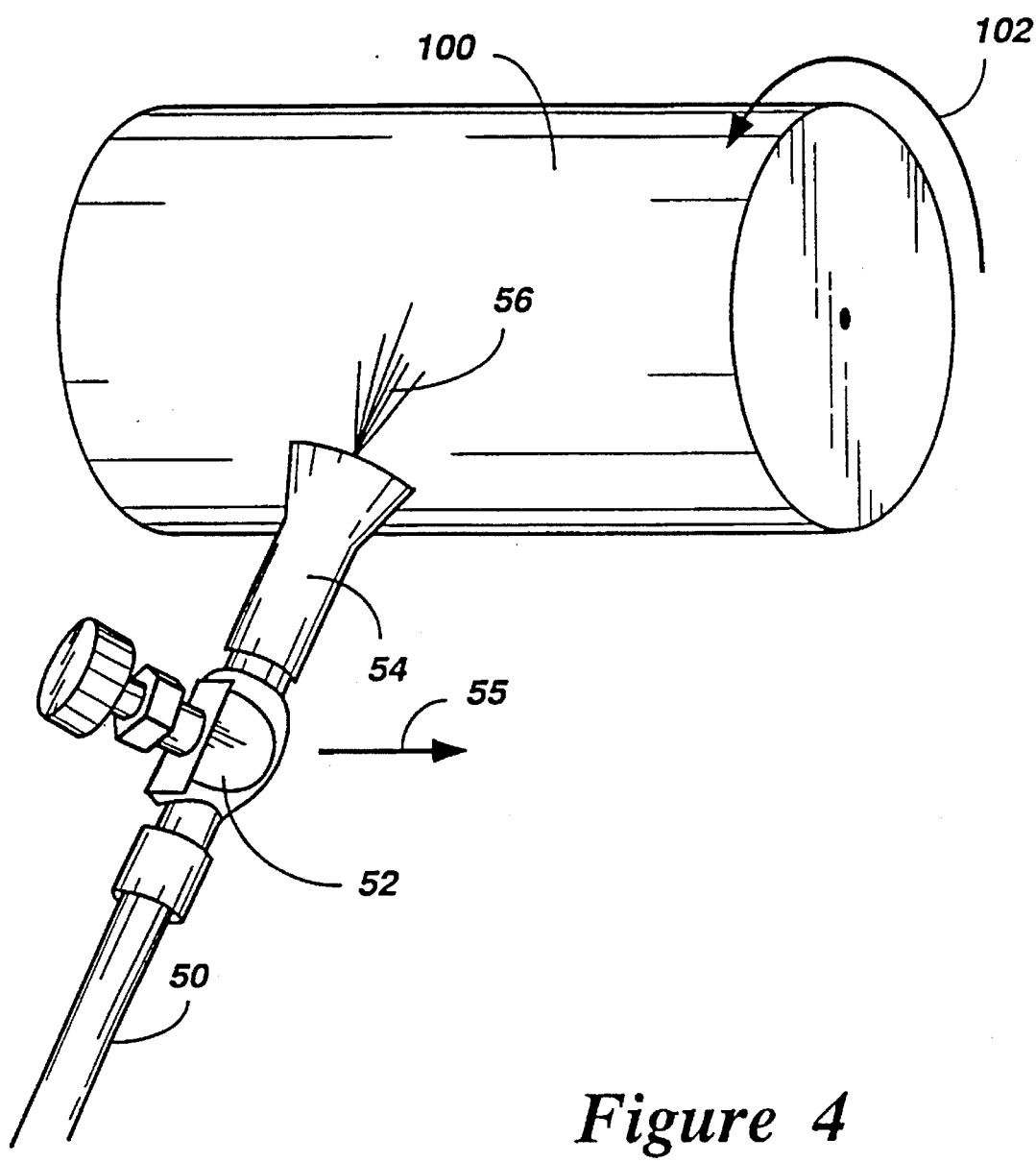
FIG. 4 is a perspective drawing of a cylindrical object being treated by the cleaning method of the present invention.

In instances where the surface to be cleaned is a cylinder, a third embodiment of the present invention is shown in FIG. 4. Here, a cylindrical surface 100 to be cleaned is rotated in a direction 102, counter to the direction of the spray 56 from the sprayhead 54. The cylinder is mounted in a chuck (not shown) and rotated by a conventional motor similar to a lathe. The cleaning spray supply is controlled by a metering valve 52, or otherwise established by the use of fixed orifices or other rate-limiting devices. In order to clean the entire cylindrical surface, the sprayhead 54 is moved along a direction 55 parallel to the major axis of the cylindrical surface 100 under treatment.

As with the first embodiment of the present invention described above, spinning the cylinder in FIG. 4 in a direction 102 counter to the direction of the spray has the effect of adding the rotational velocity of the exterior surface of the cylinder to the spray velocity to increase the effective velocity of the spray, as compared to spraying a fixed surface. Conversely, rotating the cylinder 100 in the same direction as the spray direction has the effect of reducing the effective velocity of the spray relative to the surface under treatment.

Figure 5:
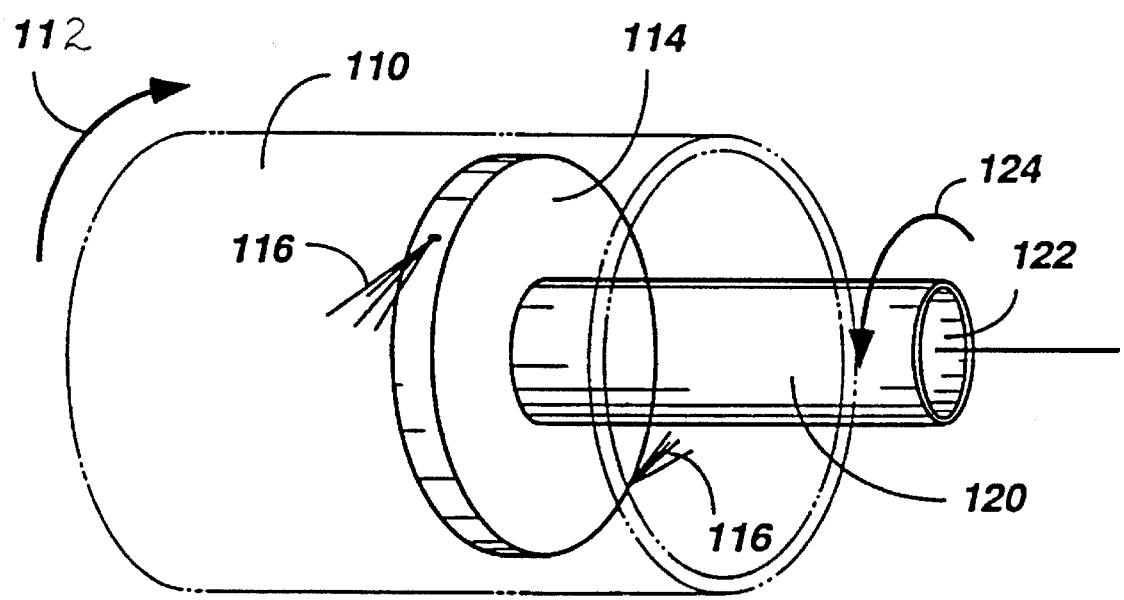
FIG. 5 is a perspective drawing showing the treatment of the interior of a cylinder according to the cleaning method of the present invention.

FIG. 5 shows another embodiment of the present invention used to clean the interior of a cylindrical surface. Here, a hollow cylinder or tube 110 is mounted in a conventional chuck (not shown) and rotated by a motor (also not shown) in a direction 112. Traveling within the tube along its major axis is a disk-shaped sprayhead 114, which provides one or more sprays 116 exiting tangentially in a direction counter to the direction of the tube rotation. The sprayhead is supported by a hollow pipe 120, and the solvent to the sprayhead is supplied through a lumen 122 in the pipe 120. As an additional, but not essential, possibility, the sprayhead 114 and its supporting pipe may be rotated in a direction 124 counter to the rotation of the tube under treatment to further increase the effective velocity of the sprays 116.

As with other embodiments of the present invention, rotation of the cylinder in a direction counter to the direction of the spray increases the effective velocity of the spray that impacts the interior surface of the cylinder. Similarly, rotation of the cylinder in the same direction as the direction of the spray reduces the effective velocity of the spray.

The foregoing illustrated embodiments are meant to illustrate practical applications of the invention, and are not in any way intended to limit other possible embodiments or uses which will readily suggest themselves to those familiar with the art.

Other embodiments, not shown, might include a ring-shaped or fly-cutter geometry sprayhead carrier, which could be rotated above the work and tilted to provide coverage of convex or concave spherical surfaces of revolution, in ways analogous to abrasive ring or cup-type curve generators used in the optical trade.

In many applications, relative movement of the sprayhead and work may be readily achieved by moving the sprayhead rather than the surface, or by moving both the sprayhead and the surface under treatment. In addition to rotating or spinning motions discussed above, raster-type linear scanning can be achieved by moving the workpiece, the sprayhead or both.

The embodiments of the invention in which an exclusive property or privilege is claimed are defined as follows:

1. Apparatus for removing contaminants from a workpiece, comprising:

a supply of cleaning material;

a sprayhead for directing a stream of the cleaning material towards the workpiece;

a support plate on which the workpiece is mounted, the support plate being disposed in front of the stream of the cleaning material;

an accelerator for accelerating the stream of cleaning material in a first direction onto a region of the support plate radially displaced from a center of the support plate and an edge of the workpiece;

a motor for rotating the support plate in a second direction that is substantially opposite the first direction of the stream of cleaning material in order to increase an effective velocity at which the cleaning material impacts the workpiece;

means for moving the sprayhead across a face of the support plate;

a sensor for detecting a position of the sprayhead in relation to the face of the support plate, the sensor producing a position signal that is proportional to the position of the sprayhead; and a control circuit that is connected to receive the position signal produced by the sensor, wherein the control circuit produces a motor drive signal that varies the speed of the motor in response to the position signal.

2. The apparatus of claim 1, further comprising:

code means disposed on the support plate for indicating an optimum rotational speed at which the support plate is to be rotated in front of the stream of cleaning material; and detecting means disposed on the sprayhead for reading the code means, the detecting means producing an optimum speed signal, wherein the control circuit is connected to receive the optimum speed signal, the control circuit producing a motor drive signal that varies the speed of the motor in response to the optimum speed signal.

3. The apparatus of claim 1, wherein the cleaning material is phase changing material.

4. The apparatus of claim 3, wherein the phase changing material is a liquid carbon dioxide.

5. Apparatus for removing contaminants from a workpiece, comprising:

a supply of cleaning material;

a sprayhead for directing a stream of the cleaning material in a first direction toward the workpiece;

a support plate on which the workpiece is mounted, the support plate being disposed in front of the stream of cleaning material;

an accelerator for accelerating the stream of cleaning material onto a region of the support plate radially displaced from a center of the support plate and an edge of the workpiece;

a motor, coupled to the support plate, for rotating the support plate in a second direction that is substantially the same as the first direction of the stream of cleaning material in order to decrease an effective velocity with which the cleaning material impacts the workpiece;

means for moving the sprayhead radially across a face of the support plate;

a sensor for detecting a position of the sprayhead in relation to the face of the support plate, the sensor producing a position signal that is proportional to the position of the sprayhead; and a control circuit that is connected to receive the position signal produced by the sensor, wherein the control circuit produces a motor drive signal that varies the speed of the motor in response to the position signal.

6. The apparatus of claim 5, further comprising:

code means disposed on the support plate for indicating an optimum rotational speed at which the support plate is to be rotated in front of the stream of cleaning material; and detecting means disposed on the sprayhead for reading the code means, the detecting means producing an optimum speed signal, wherein the control circuit is connected to receive the optimum speed signal, the control circuit producing a motor drive signal that varies the speed of the motor in response to the optimum speed signal.

7. The apparatus of claim 5, wherein the cleaning material is phase changing material.

8. The apparatus of claim 7, wherein the phase changing material is a liquid carbon dioxide.

9. Apparatus for removing contaminants from a workpiece, comprising:

a supply of cleaning material;

a sprayhead for directing a stream of the cleaning material towards the workpiece;

a support plate on which the workpiece is mounted, the support plate being disposed in front of the stream of the cleaning material;

an accelerator for accelerating the stream of cleaning material in a first direction onto a region of the support plate radially displaced from a center of the support plate and an edge of the workpiece;

a motor for rotating the support plate in a second direction opposite the first direction of the stream of cleaning material in order to increase an effective velocity at which the cleaning material impacts the workpiece;

means for moving the sprayhead across a face of the support plate;

a sensor for detecting a position of the sprayhead in relation to the face of the support plate, the sensor producing a position signal that is proportional to the position of the sprayhead; and a control circuit that is connected to receive the position signal produced by the sensor, wherein the control circuit produces a motor drive signal that varies the speed of the motor in response to the position signal such that the stream of cleaning material impacts the workpiece with a substantially constant effective velocity as the sprayhead moves radially across the face of the support plate.

10. The apparatus of claim 9, wherein the cleaning material is phase changing material.

11. The apparatus of claim 10, wherein the phase changing material is a liquid carbon dioxide.

12. Apparatus for removing contaminants from a workpiece, comprising:

a supply of cleaning material;

a sprayhead for directing the stream of cleaning material onto the workpiece;

a support plate on which the workpiece is mounted, the support plate being disposed in front of the stream of cleaning material;

an accelerator for accelerating the stream of cleaning material onto the workpiece;

a motor for moving the workpiece in relation to the stream of cleaning material in order to vary a velocity at which the cleaning material impacts the workpiece;

a code disposed on the support plate for indicating an optimum rotational speed at which the support plate is to be rotated in front of the stream of cleaning material;

a detector disposed on the sprayhead for reading the code, the detector producing an optimum speed signal; and a control circuit that is connected to receive the optimum speed signal, the control circuit producing a motor drive signal that varies the speed of the motor in response to the optimum speed signal.

13. The apparatus of claim 12, wherein the cleaning material is phase changing material.

14. The apparatus of claim 13, wherein the phase changing material is a liquid carbon dioxide.

15. Apparatus for removing contaminants from a workpiece, comprising:

a supply of cleaning material;

a spray head for directing a stream of the cleaning material towards the workpiece;

a support plate on which the workpiece is mounted, the support plate being disposed in front of the stream of cleaning material;

an accelerator for accelerating the stream of cleaning material in a first direction onto the support plate;

means for moving the sprayhead radially across a face of the support plate; and means for rotating the support plate in a second direction opposite the first direction of the stream of cleaning material in order to increase an effective velocity at which the stream of cleaning material impacts the workpiece, wherein the support plate is rotated at a velocity that is proportional to the position of the sprayhead in front of the support plate.

16. Apparatus for removing contaminants from a workpiece, comprising:

a supply of cleaning material;

a sprayhead for directing a stream of the cleaning material towards the workpiece;

a support plate on which the workpiece is mounted, the support plate being disposed in front of the stream of cleaning material;

an accelerator for accelerating the stream of cleaning material in a first direction onto the support plate;

means for moving the sprayhead radially across a face of the support plate; and means for rotating the support plate in a second direction the same direction as the first direction of the stream of cleaning material in order to decrease an effective velocity at which the stream of cleaning material impacts the workpiece, wherein the support plate is rotated at a velocity that is proportional to the position of the sprayhead in front of the support plate.

* * * * *